United States Patent
Sugiura et al.

[19]

[11] Patent Number: 6,088,207
[45] Date of Patent: *Jul. 11, 2000

[54] OVER-VOLTAGE PROTECTION APPARATUS AND VEHICULAR DIRECTION INDICATING APPARATUS WITH OVER-VOLTAGE PROTECTION

[75] Inventors: Akira Sugiura, Okazaki; Fukuo Ishikawa, Kariya; Hiroyuki Ban, Aichi-ken, all of Japan

[73] Assignees: Anden Co., Ltd.; Denso Corporation

[*] Notice: This patent issued on a continued prosecution application filed under 37 CFR 1.53(d), and is subject to the twenty year patent term provisions of 35 U.S.C. 154(a)(2).

[21] Appl. No.: 09/115,835

[22] Filed: Jul. 15, 1998

[30] Foreign Application Priority Data

Jul. 15, 1997 [JP] Japan ................................. 9-189861
Jul. 25, 1997 [JP] Japan ................................. 9-200433

[51] Int. Cl.[7] ........................................................ H02H 3/20
[52] U.S. Cl. ............................................ 361/91.2; 307/10.8
[58] Field of Search ................................. 361/54, 56, 57, 361/79, 91, 93, 93.1, 93.7, 93.9, 91.1, 91.2; 307/9.1, 10.1, 10.7, 10.8

[56] References Cited

U.S. PATENT DOCUMENTS 5,130,883  7/1992  Edwards ..................................... 361/91
5,444,595  8/1995  Ishikawa et al. ........................... 361/86
5,838,526  11/1998  Ishikawa et al. ........................ 361/118

*Primary Examiner*—Ronald W. Leja
*Attorney, Agent, or Firm*—Pillsbury Madison & Sutro

[57] ABSTRACT

An over-voltage protection apparatus includes a power feed line. A load has a given low impedance. A current supplying device operates for supplying a current to the load via the power feed line. A load drive device operates for controlling the supply of the current to the load by the current supplying device. An over-voltage detecting device operates for detecting an over-voltage at the power feed line. A discharge command device operates for, when the over-voltage at the power feed line is detected by the over-voltage detecting device, controlling the load drive device to enable a discharge current to flow from the power feed line into the load and thereby to remove the over-voltage from the power feed line through discharge. A current detecting device operates for detecting the discharge current. A discharge continuing device operates for continuing the discharge and the flow of the discharge current from the power feed line in cases where the discharge current detected by the current detecting device exceeds a predetermined reference level.

4 Claims, 10 Drawing Sheets

OVER-VOLTAGE PROTECTION APPARATUS AND VEHICULAR DIRECTION INDICATING APPARATUS WITH OVER-VOLTAGE PROTECTION

BACKGROUND OF THE INVENTION

1. Field of the Invention

This invention relates to an over-voltage protection apparatus. Also, this invention relates to a vehicular direction indicating apparatus with over-voltage protection.

2. Description of the Related Art

In a general power feed system, a load drive switch is interposed in a power feed line connected between a power supply and a load. It is known to provide such a power feed system with an over-voltage protection device. The known over-voltage protection device has a section for detecting an over-voltage induced at the power feed line by one of various causes. When such an over-voltage is detected, the known over-voltage protection device forces the load drive switch into its conductive state to allow the escape of the over-voltage toward the load.

In the case where the load is a vehicular direction indicator having a very small impedance, when the load drive switch is forced into its conductive state in response to an over-voltage, the voltage at the power feed line abruptly drops. The abrupt drop in the voltage returns the load drive switch to its non-conductive state. The return of the load drive switch to its non-conductive state tends to cause an over-voltage again due to the inductance of the power feed line. As a result, the load drive switch oscillates between its conductive state and its non-conductive state. In other words, the load drive switch chatters.

SUMMARY OF THE INVENTION

It is a first object of this invention to provide an improved over-voltage protection apparatus.

It is a second object of this invention to provide a vehicular direction indicating apparatus with over-voltage protection.

A first aspect of this invention provides an over-voltage protection apparatus comprising a power feed line; a load having a given low impedance; current supplying means for supplying a current to the load via the power feed line; load drive means for controlling the supply of the current to the load by the current supplying means; over-voltage detecting means for detecting an over-voltage at the power feed line; discharge command means for, when the over-voltage at the power feed line is detected by the over-voltage detecting means, making the load drive means conductive to discharge a power of the over-voltage from the power feed line into the load and thereby to remove the over-voltage from the power feed line through discharge; and discharge continuing means for continuing a state in which the power of the over-voltage is discharged during a given time.

A second aspect of this invention provides an over-voltage protection apparatus comprising a power feed line; a load having a given low impedance; current supplying means for supplying a current to the load via the power feed line; load drive means for controlling the supply of the current to the load by the current supplying means; over-voltage detecting means for detecting an over-voltage at the power feed line; discharge command means for, when the over-voltage at the power feed line is detected by the over-voltage detecting means, controlling the load drive means to enable a discharge current to flow from the power feed line into the load and thereby to remove the over-voltage from the power feed line through discharge; current detecting means for detecting the discharge current; and discharge continuing means for continuing the discharge and the flow of the discharge current from the power feed line in cases where the discharge current detected by the current detecting means exceeds a predetermined reference level.

A third aspect of this invention is based on the second aspect thereof, and provides an over-voltage protection apparatus wherein the load includes a vehicular direction indicating lamp, and the load drive means includes a relay connected between the vehicular direction indicating lamp and the power feed line.

A fourth aspect of this invention provides a vehicular direction indicating apparatus with over-voltage protection which comprises a power feed line; a direction indicating lamp forming a load; current supplying means for supplying a current to the direction indicating lamp via the power feed line; load drive means for alternately permitting and inhibiting the supply of the current to the direction indicating lamp by the current supplying means at an alternation period; on-and-off period setting means for controlling the alternation period used by the load drive means to set an on-and-off period of the direction indicating lamp; over-voltage detecting means for detecting an over-voltage at the power feed line; discharge command means for, when the over-voltage at the power feed line is detected by the over-voltage detecting means, making the load drive means conductive to enable a discharge current to flow from the power feed line and thereby to remove the over-voltage from the power feed line through discharge; and discharge time setting means for setting a time interval during which the load drive means continues to be made conductive by the discharge command means in response to the over-voltage detected by the over-voltage detecting means.

A fifth aspect of this invention provides an apparatus comprising a battery; a switch; a load connected to the battery via the switch; first means connected to the battery for detecting an over-voltage across the battery which exceeds a predetermined reference level; second means connected to the switch and the first means for closing the switch in response to the over-voltage detected by the first means; and third means connected to the switch for holding the switch closed during a given time interval after the switch is closed by the second means.

A sixth aspect of this invention is based on the fifth aspect thereof, and provides an apparatus further comprising fourth means connected to the first means and the third means for disabling the third means in cases where the over-voltage detected by the first means has disappeared when the switch is closed by the second means.

A seventh aspect of this invention is based on the fifth aspect thereof, and provides an apparatus wherein the load comprises a lamp.

DESCRIPTION OF THE PREFERRED EMBODIMENTS

A prior-art vehicular direction indicating apparatus with over-voltage protection will be explained hereinafter for a better understanding of this invention.

The prior-art vehicular direction indicating apparatus includes a control switch (a relay switch) interposed in a power feed line connected between a power supply and a direction indicating lamp. When the control switch is in an on state (a closed state), the direction indicating lamp is activated by the power supply. When the control switch is changed to an off state (an open state), the direction indicating lamp is deactivated. The control switch is operated in response to a direction indicating request. In addition, the control switch is operated for over-voltage protection.

The prior-art vehicular direction indicating apparatus also includes a sensor for detecting a voltage at the power feed line, and a comparator for comparing the detected voltage with a predetermined reference level to detect an over-voltage at the power feed line. When the detected voltage at the power feed line exceeds the reference level, that is, when an over-voltage occurs at the power feed line, the comparator forces the control switch into its on state to allow the escape of the over-voltage toward the direction indicating lamp.

Figure 1:
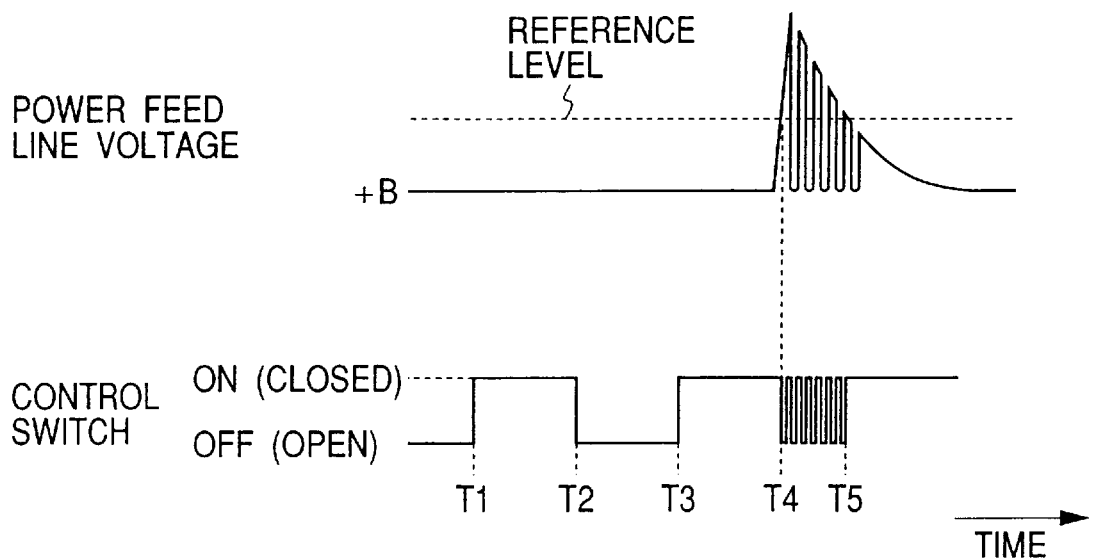
FIG. 1 is a time-domain diagram of the state of a control switch in a prior-art vehicular direction indicating apparatus with over-voltage protection.

It is assumed that as shown in FIG. 1, the control switch is periodically changed between its on state (its closed state) and its off state (its open state) in response to a direction indicating request to intermittently activate the direction indicating lamp. Specifically, at a moment T1, the control switch is changed from its off state to its on state to activate the direction indicating lamp. During the time interval between the moment T1 and a subsequent moment T2, the control switch is held in its on state to continue the activation of the direction indicating lamp. At the moment T2, the control switch is changed from its on state to its off state to deactivate the direction indicating lamp. During the time interval between the moment T2 and a subsequent moment T3, the control switch is held in its off state to continue the deactivation of the direction indicating lamp. At the moment T3, the control switch is changed from its off state to its on state to activate the direction indicating lamp. During the time interval between the moment T3 and a subsequent moment T4, the control switch is held in its on state to continue the activation of the direction indicating lamp. At the moment T4, the control switch is changed from its on state to its off state to deactivate the direction indicating lamp.

It is assumed that an over-voltage occurs at the power feed line immediately after the moment T4. The control switch is forced into its on state in response to the over-voltage which exceeds a reference level. When the control switch assumes its on state, the voltage at the power feed line abruptly drops. The abrupt drop in the voltage returns the control switch to its off state. The return of the control switch to its off state tends to cause an over-voltage again due to the inductance of the power feed line. Such processes are iterated. Accordingly, as shown in FIG. 1, the control switch oscillates between its on state and its off state at a high frequency after the moment T4. In other words, the control switch chatters after the moment T4. At a later moment T5, the contacts of the control switch are fused together, and hence the control switch sticks in its on state. After the moment T5, the control switch continues to be in its on state even in the absence of a direction indicating request and an over-voltage.

First Embodiment

Figure 2:
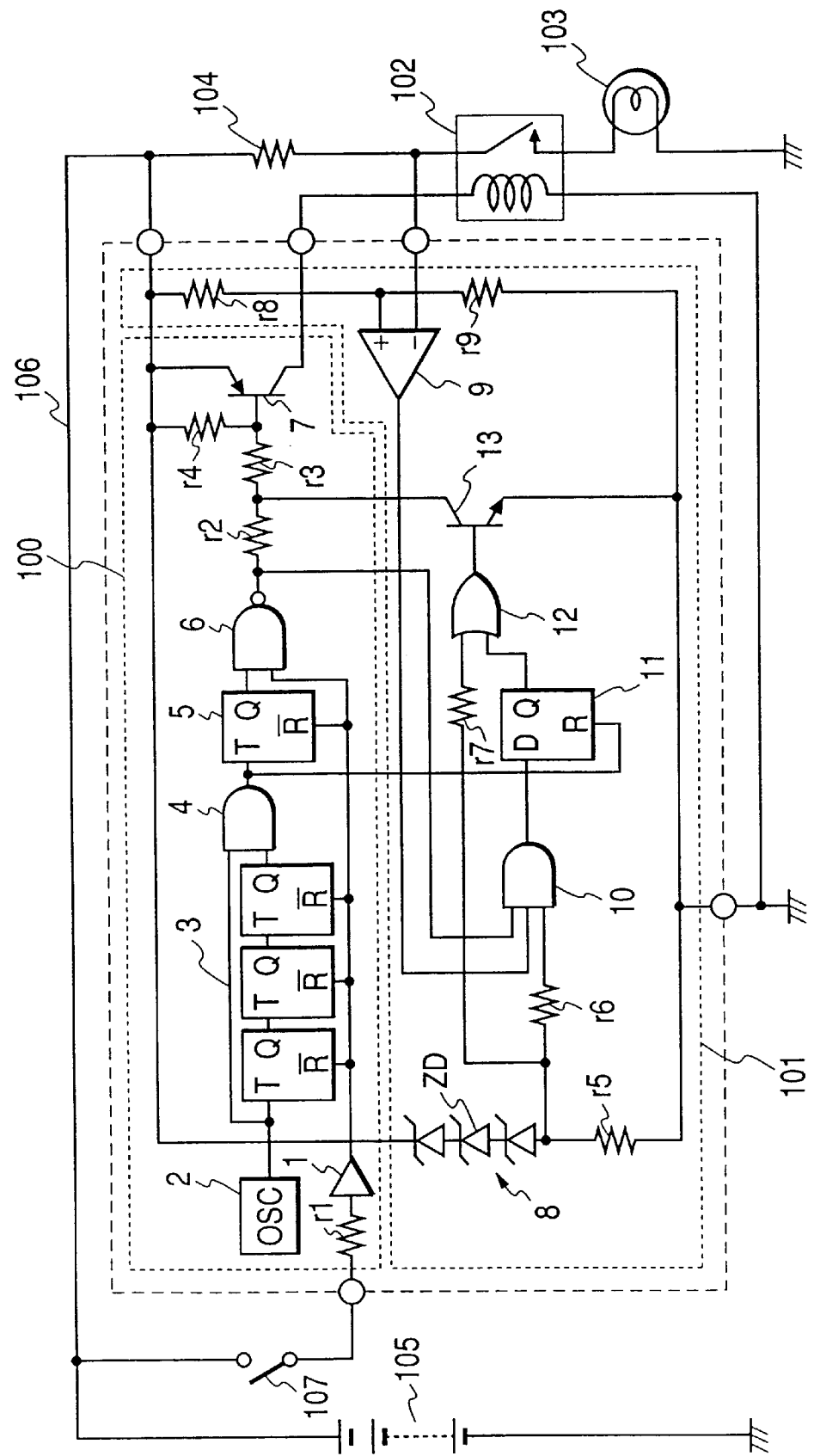
FIG. 2 is a diagram of a vehicular direction indicating apparatus with over-voltage protection according to a first embodiment of this invention.

FIG. 2 shows a vehicular direction indicating apparatus with over-voltage protection according to a first embodiment of this invention. The apparatus of FIG. 2 includes a direction indicating circuit 100, an over-voltage protection circuit 101, a relay 102, a direction indicator or a direction indicating lamp 103, and a current sensing resistor 104. The direction indicating circuit 100, the over-voltage protection circuit 101, the relay 102, the direction indicating lamp 103, and the current sensing resistor 104 are connected to a battery 105 via a power feed line 106. The direction indicating circuit 100, the over-voltage protection circuit 101, the relay 102, the direction indicating lamp 103, and the current sensing resistor 104 are supplied with electric energy from the battery 105 via the power feed line 106. The direction indicating lamp 103 forms a load on the battery 105. A direction indicating switch 107 is connected between the direction indicating circuit 100 and the battery 105.

Specifically, the positive terminal of the battery 105 is connected to a first end of the current sensing resistor 104 via the power feed line 106. The negative terminal of the battery 105 is grounded. A second end of the current sensing resistor 104 is connected via a switch of the relay 102 to a first end of the direction indicating lamp 103. The switch of the relay 102 is of the normally-open type. A second end of the direction indicating lamp 103 is grounded. A first end of a control winding of the relay 102 is connected to the direction indicating circuit 100. A second end of the control winding of the relay 102 is grounded.

The positive terminal of the battery 105 is also connected to the direction indicating circuit 100 and the over-voltage protection circuit 101 via the power feed line 106. Furthermore, the positive terminal of the battery 105 is connected via the direction indicating switch 107 to the direction indicating circuit 100. The junction between the current sensing resistor 104 and the switch of the relay 102 is connected to the over-voltage protection circuit 101.

The direction indicating circuit 100 includes an input signal detection circuit 1, an oscillation circuit 2, a timer circuit 3, an AND gate 4, a frequency division circuit 5, a NAND gate 6, a load drive switch 7, and resistors r1, r2, r3, and r4. The oscillation circuit 2 generates and outputs a clock pulse signal having a predetermined frequency. The timer circuit 3 includes a series combination of T flip-flops. The frequency division circuit 5 includes a T flip-flop. The load drive switch 7 includes a PNP transistor.

The input terminal of the input signal detection circuit 1 is connected via the resistor r1 to the direction indicating switch 107. The direction indicating switch 107 is connected to the positive terminal of the battery 105. The output terminal of the input signal detection circuit 1 is connected to a reset terminal of the timer circuit 3, a reset terminal of the frequency division circuit 5, and a first input terminal of the NAND gate 6. The output terminal of the oscillation circuit 2 is connected to the input terminal of the timer circuit 3 and a first input terminal of the AND gate 4. The output terminal of the timer circuit 3 is connected to a second input terminal of the AND gate 4. The output terminal of the AND gate 4 is connected to the input terminal of the frequency division circuit 5. The output terminal of the frequency division circuit 5 is connected to a second input terminal of the NAND gate 6. The output terminal of the NAND gate 6 is connected to the base of the transistor 7 via a series combination of the resistors r2 and r3. The emitter of the transistor 7 is connected via the power feed line 106 to the positive terminal of the battery 105. The collector of the transistor 7 is grounded via the control winding of the relay 102. A first end of the resistor r4 is connected to the base of the transistor 7. A second end of the resistor r4 is connected via the power feed line 106 to the positive terminal of the battery 105.

The over-voltage protection circuit 101 includes an over-voltage detection circuit 8, a load current detection circuit 9, an AND gate 10, a latch circuit 11, an OR gate 12, an NPN transistor 13, and resistors r5, r6, r7, r8, and r9. The over-voltage detection circuit 8 includes a cascade combination of Zener diodes ZD. The over-voltage detection circuit 8 also includes the resistor r5 which is connected in series with the cascade combination of the Zener diodes ZD. The load current detection circuit 9 includes a comparator. The latch circuit 11 includes, for example, a D flip-flop.

The cathode end of the Zener diode combination within the over-voltage detection circuit 8 is connected via the power feed line 106 to the positive terminal of the battery 105. The anode end of the Zener diode combination within the over-voltage detection circuit 8 is grounded via the resistor r5. Also, the anode end of the Zener diode combination within the over-voltage detection circuit 8 is connected via the resistor r6 to a first input terminal of the AND gate 10. Furthermore, the anode end of the Zener diode combination within the over-voltage detection circuit 8 is connected via the resistor r7 to a first end of the OR gate 12. A first end of the resistor r8 is connected via the power feed line 106 to the positive terminal of the battery 105. A second end of the resistor r8 is connected to a first input terminal of the load current detection circuit 9 and a first end of the resistor r9. A second end of the resistor r9 is grounded. A second input terminal of the load current detection circuit 9 is connected to the junction between the current sensing resistor 104 and the switch of the relay 102.

The output terminal of the load current detection circuit 9 is connected to a second input terminal of the AND gate 10. A third input terminal of the AND gate 10 is connected to the output terminal of the NAND gate 6 within the direction indicating circuit 100. The output terminal of the AND gate 10 is connected to the input terminal of the latch circuit 11. A reset terminal of the latch circuit 11 is connected to the output terminal of the AND gate 4 within the direction indicating circuit 100. The output terminal of the latch circuit 11 is connected to a second input terminal of the OR gate 12. The output terminal of the OR gate 12 is connected to the base of the transistor 13. The emitter of the transistor 13 is grounded. The collector of the transistor 13 is connected to the junction between the resistors r2 and r3 within the direction indicating circuit 100.

The apparatus of FIG. 2 operates in a mode which can change among different modes including a direction indicating mode, a long over-voltage responsive mode, and a short over-voltage responsive mode.

The direction indicating mode of operation of the apparatus of FIG. 2 will be explained hereinafter. When the direction indicating switch 107 is closed, the voltage across the battery 105 is transmitted to the input signal detection circuit 1 via the switch 107 and the resistor r1. The input signal detection circuit 1 includes a waveform shaping circuit which converts the transmitted battery voltage into a high-level signal. The input signal detection circuit 1 outputs the high-level signal to the NAND gate 6. At the same time, the input signal detection circuit 1 outputs the high-level signal to the reset terminals of the timer circuit 3 and the frequency division circuit 5, thereby resetting the timer circuit 3 and the frequency division circuit 5. The frequency division circuit 5 outputs a high-level signal to the NAND gate 6 when being reset. The NAND gate 6 outputs a low-level signal in response to the high-level signals outputted from the input signal detection circuit 1 and the frequency division circuit 5. The low-level signal is transmitted from the NAND gate 6 to the base of the transistor 7 via the resistors r2 and r3 so that the emitter-collector path of the transistor 7 changes to a conductive state (an on state). When the transistor 7 changes to its conductive state, a current generated by the battery 105 flows through the power feed line 106, the transistor 7, and the control winding of the relay 102. Thus, the control winding of the relay 102 is energized so that the switch of the relay 102 is closed. When the switch of the relay 102 is closed, a current generated by the battery 105 flows through the power feed line 106, the current sensing resistor 104, the switch of the relay 102, and the direction indicating lamp 103. As a result, the direction indicating lamp 103 is activated.

The timer circuit 3 counts clock pulses in the output signal of the oscillation circuit 2. After the timer circuit 3 is reset by the high-level signal from the input signal detection circuit 1, the timer circuit 3 repetitively outputs a high-level signal to the AND gate 4 at a setting period (a setting time) corresponding to a predetermined number of counted clock pulses. The setting period (the setting time) is equal to, for example, about 350 ms. The output signal of the oscillation circuit 2 is applied to the AND gate 4. The AND gate 4 outputs a high-level signal to the frequency division circuit 5 each time both the output signals of the oscillation circuit 2 and the timer circuit 3 assume high-level states. Accordingly, the AND gate 4 feeds a pulse signal to the frequency division circuit 5. Since the output signal of the oscillation circuit 2 has the predetermined frequency, the pulse signal fed to the frequency division circuit 5 from the AND gate 4 has a given frequency. The frequency division circuit 5 halves the frequency of the output signal of the AND gate 4, thereby generating and outputting a binary signal which periodically changes between a high-level state and a low-level state at a frequency equal to the half of the frequency of the output signal of the AND gate 4. The frequency division circuit 5 feeds the binary signal to the NAND gate 6. As long as the output signal of the input signal detection circuit 1 remains in the high-level state, the NAND gate 6 outputs a binary signal which agrees with an inversion of the output signal of the frequency division circuit 5. The output signal of the NAND gate 6 is applied to the base of the transistor 7 via the resistors r2 and r3. As long as the output signal of the input signal detection circuit 1 remains in the high-level state, the binary signal applied to the base of the transistor 7 from the NAND gate 6 periodically changes between a high-level state and a low-level state. When the binary signal applied to the base of the transistor 7 assumes the high-level state, the transistor 7 changes to a non-conductive state (an off state). The non-conductive transistor 7 cuts off a current through the control winding of the relay 102. Thus, the control winding of the relay 102 is de-energized so that the switch of the relay 102 is opened. When the switch of the relay 102 is opened, a current is inhibited from flowing through the direction indicating lamp 103. As a result, the direction indicating lamp 103 is deactivated. When the binary signal applied to the base of the transistor 7 assumes the low-level state, the transistor 7 changes to its conductive state (its on state). The conductive transistor 7 permits a current to flow through the control winding of the relay 102. Thus, the control winding of the relay 102 is energized so that the switch of the relay 102 is closed. When the switch of the relay 102 is closed, a current is permitted to flow through the direction indicating lamp 103. As a result, the direction indicating lamp 103 is activated. Therefore, as long as the output signal of the input signal detection circuit 1 remains in the high-level state, the direction indicating lamp 103 is alternately activated and deactivated at a given period which corresponds to the frequency of the binary signal applied to the base of the transistor 7 from the NAND gate 6.

A resistor connected between the resistor r1 and the ground may be used as the input signal detection circuit 1. In this case, it is preferable to provide a Zener diode in the input signal detection circuit 1 to prevent the voltage of the output signal of the input signal detection circuit 1 from excessively rising.

The long over-voltage responsive mode of operation of the apparatus of FIG. 2 will be explained hereinafter. It is assumed that an over-voltage occurs at the power feed line 106 during a time interval longer than the delay time of response operation of the relay 102. The delay time of response operation of the relay 102 is equal to, for example, about 10 ms. The over-voltage detection circuit 8 is subjected to the voltage at the power feed line 106 (that is, the voltage across the battery 105). When the voltage at the power feed line 106 exceeds a predetermined reference level, the over-voltage detection circuit 8 outputs a high-level signal to the OR gate 12 via the resistor r7 as an indication of the occurrence of an over-voltage. The predetermined reference voltage is given by the breakdown voltage related to the Zener diode combination within the over-voltage detection circuit 8. The high-level signal indicative of the over-voltage passes through the OR gate 12, and then reaches the base of the transistor 13 so that the emitter-collector path of the transistor 13 changes to a conductive state (an on state). Even in the case where the output signal of the NAND gate 6 is in its high-level state, when the transistor 13 changes to its conductive state, the transistor 7 falls into its conductive state. When the transistor 7 assumes its conductive state, a current is permitted to flow into the control winding of the relay 102 from the power feed line 106 via the transistor 7. Thus, the control winding of the relay 102 is energized so that the switch of the relay 102 is closed. The moment of the closing of the relay switch follows the moment of the energization of the relay control winding by a time interval equal to the delay time of response operation of the relay 102. When the switch of the relay 102 is closed, the over-voltage is allowed to escape from the power feed line 106 toward the ground via the current sensing resistor 104, the switch of the relay 102, and the direction indicating lamp 103.

The resistors r8 and r9 cooperate to divide the voltage at the power feed line 106. The division-resultant voltage is applied to the comparator 9 as a reference voltage. The voltage at the junction between the current sensing resistor 104 and the switch of the relay 102 depends on a voltage drop across the current sensing resistor 104. The voltage drop across the current sensing resistor 104 is proportional to the current flowing therethrough, that is, the current flowing through the direction indicating lamp 103. The voltage at the junction between the current sensing resistor 104 and the switch of the relay 102 is applied to the comparator 9 as an indication of the current flowing through the direction indicating lamp 103. The device 9 compares the current-indicating voltage with the previously-mentioned reference voltage. When the current-indicating voltage is lower than the reference voltage, the comparator 9 outputs a high-level signal to the AND gate 10. The comparator 9 operates to detect whether the switch of the relay 102 is closed or opened. When the switch of the relay 102 is closed, the comparator 9 outputs a high-level signal.

The over-voltage detection circuit 8 outputs the high-level signal indicative of the over-voltage also to the AND gate 10. The output signal of the NAND gate 6 is applied to the AND gate 10. The AND gate 10 outputs a high-level signal to the latch circuit 11 only when the output signals of the NAND gate 6, the over-voltage detection circuit 8, and the comparator 9 are in high-level states. In other words, the AND gate 10 outputs a high-level signal only in the case where an over-voltage occurs at the power feed line 106 and the output signal of the NAND gate 6 requires the direction indicating lamp 103 to be deactivated, and a given current or greater flows through the direction indicating lamp 103 when the switch of the relay 102 is closed in response to the over-voltage. Generally, when the output signal of the comparator 9 changes to the high-level state which indicates that the switch of the relay 102 is closed, the AND gate 10 outputs a high-level signal provided that the over-voltage remains detected by the over-voltage detection circuit 8. Accordingly, the AND gate 10 outputs a high-level signal in response to an over-voltage having a long lifetime. The device 11 latches the high-level signal outputted from the AND gate 10. The latched high-level signal is outputted from the latch circuit 11. The output signal of the AND gate 4 within the direction indicating circuit 100 is applied to the reset terminal of the latch circuit 11. The latch circuit 11 is reset in response to every given-type change of the output signal of the AND gate 4 between its low-level state and its high-level state. The latch circuit 11 outputs a low-level signal when being reset. Accordingly, the latch circuit 11 outputs a high-level signal only during the time interval between the moment of the change of the output signal of the AND gate 10 to its high-level state and the moment at which the latch circuit 11 is reset in response to the output signal of the AND gate 4. The high-level signal travels from the latch circuit 11 to the base of the transistor 13 via the OR gate 12. The high-level signal outputted from the latch circuit 11 holds the transistor 13 in its conductive state even if the output signal of the over-voltage detection circuit 8 changes to its low-level state. The transistor 7 remains in its conductive state as long as the transistor 13 is in its conductive state. Accordingly, the current continues to flow into the control winding of the relay 102 from the power feed line 106 via the transistor 7. Thus, the control winding of the relay 102 remains energized so that the switch of the relay 102 continues to be closed. When the output signal of the latch circuit 11 changes to its low-level state, the transistor 13 changes to a non-conductive state (an off state). Provided that the output signal of the NAND gate 6 is in its high-level state, the change of the transistor 13 to its non-conductive state causes the transistor 7 to fall into its non-conductive state. When the transistor 7 assumes its non-conductive state, the current is inhibited from flowing through the control winding of the relay 102. Thus, the control winding of the relay 102 is de-energized so that the switch of the relay 102 is opened. In this way, the switch of the relay 102 remains closed during the time interval determined by the latch circuit 11. Accordingly, the switch of the relay 102 is prevented from chattering or oscillating between its open state and its closed state at a high frequency.

The short over-voltage responsive mode of operation of the apparatus of FIG. 2 will be explained hereinafter. It is assumed that an over-voltage occurs at the power feed line 106 during a time interval shorter than the delay time of response operation of the relay 102. The over-voltage detection circuit 8 is subjected to the voltage at the power feed line 106 (that is, the voltage across the battery 105). When the voltage at the power feed line 106 exceeds the predetermined reference level, the over-voltage detection circuit 8 outputs a high-level signal to the OR gate 12 via the resistor r7 as an indication of the occurrence of an over-voltage. The high-level signal indicative of the over-voltage passes through the OR gate 12, and then reaches the base of the transistor 13 so the transistor 13 changes to its conductive state. Even in the case where the output signal of the NAND gate 6 is in its high-level state, when the transistor 13 changes to its conductive state, the transistor 7 falls into its conductive state. When the transistor 7 assumes its conductive state, a current is permitted to flow into the control winding of the relay 102 from the power feed line 106 via the transistor 7. Thus, the control winding of the relay 102 is energized so that the switch of the relay 102 is closed. The moment of the closing of the relay switch follows the moment of the energization of the relay control winding by a time interval equal to the delay time of response operation of the relay 102. Before the switch of the relay 102 is closed, the over-voltage disappears because of the short lifetime thereof so that the output signal of the over-voltage detection circuit 8 returns to its low-level state. Thus, the AND gate 10 remains closed and the output signal of the AND gate 10 continues to be in its low-level state regardless of the logic state of the output signal from the comparator 9. When the output signal of the over-voltage detection circuit 8 returns to its low-level state, the OR gate 12 outputs a low-level signal to the base of the transistor 13 so that the transistor 13 changes to its non-conductive state. Provided that the output signal of the NAND gate 6 is in its high-level state, the change of the transistor 13 to its non-conductive state causes the transistor 7 to fall into its non-conductive state. When the transistor 7 assumes its non-conductive state, the current is inhibited from flowing through the control winding of the relay 102. Thus, the control winding of the relay 102 is de-energized so that the switch of the relay 102 is opened. In this way, the switch of the relay 102 is closed during only a short time interval.

The direction indicating mode and the long over-voltage responsive mode of operation of the apparatus of FIG. 2 will be further explained hereinafter.

Figure 3:
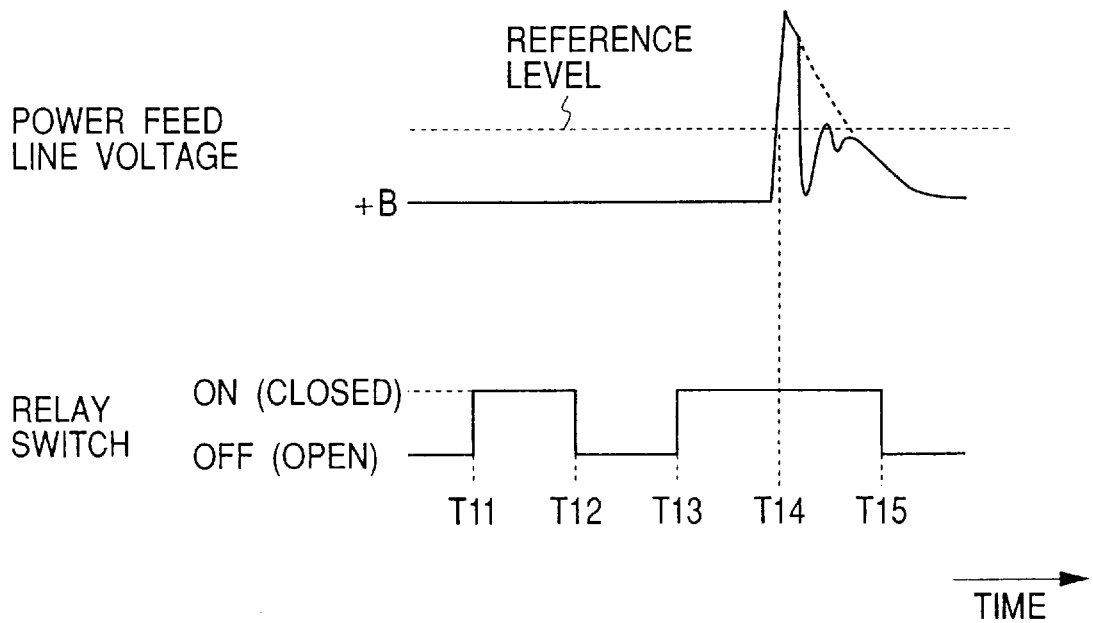
FIG. 3 is a time-domain diagram of a voltage at a power feed line and the state of a relay switch in the apparatus of FIG. 2.

It is assumed that as shown in FIG. 3, the switch of the relay 102 is periodically changed between its closed state (its on state) and its open state (its off state) in response to a direction indicating request to intermittently activate the direction indicating lamp 103. Specifically, at a moment T11, the switch of the relay 102 is changed from its off state to its on state to activate the direction indicating lamp 103. During the time interval between the moment T11 and a subsequent moment T12, the switch of the relay 102 is held in its on state to continue the activation of the direction indicating lamp 103. At the moment T12, the switch of the relay 102 is changed from its on state to its off state to deactivate the direction indicating lamp 103. During the time interval between the moment T12 and a subsequent moment T13, the switch of the relay 102 is held in its off state to continue the deactivation of the direction indicating lamp 103. At the moment T13, the switch of the relay 102 is changed from its off state to its on state to activate the direction indicating lamp 103. During the time interval between the moment T13 and a subsequent moment T14, the switch of the relay 102 is held in its on state to continue the activation of the direction indicating lamp 103.

It is assumed that as shown in FIG. 3, an over-voltage occurs during a time interval containing the moment T14. The over-voltage detection circuit 8 outputs a high-level signal to the base of the transistor 13 via the resistor r7 and the OR gate 12 during the presence of the over-voltage. The high-level output signal of the over-voltage detection circuit 8 holds the switch of the relay 102 in its on state after the moment T14. When the over-voltage disappears, the output signal of the over-voltage detection circuit 8 changes to its low-level state. On the other hand, the latch circuit 11 starts outputting a high-level signal to the base of the transistor 13 via the OR gate 12 when the output signal of the NAND gate 6 changes to its high-level state. The latch circuit 11 continues to output the high-level signal during a given time interval. The high-level output signal of the latch circuit 11 holds the switch of the relay 102 in its on state after the over-voltage disappears. When the given time interval ends, the output signal of the latch circuit 11 returns to its low-level state. The low-level output signal of the latch circuit 11 changes the switch of the relay 102 to its off state at a moment T15 after the moment T14. After the over-voltage disappears, the switch of the relay 102 is thus held in its on state by the latch circuit 11 during a certain time interval. Accordingly, the switch of the relay 102 is prevented from chattering or oscillating between its on state and its off state at a high frequency.

Second Embodiment

Figure 4:
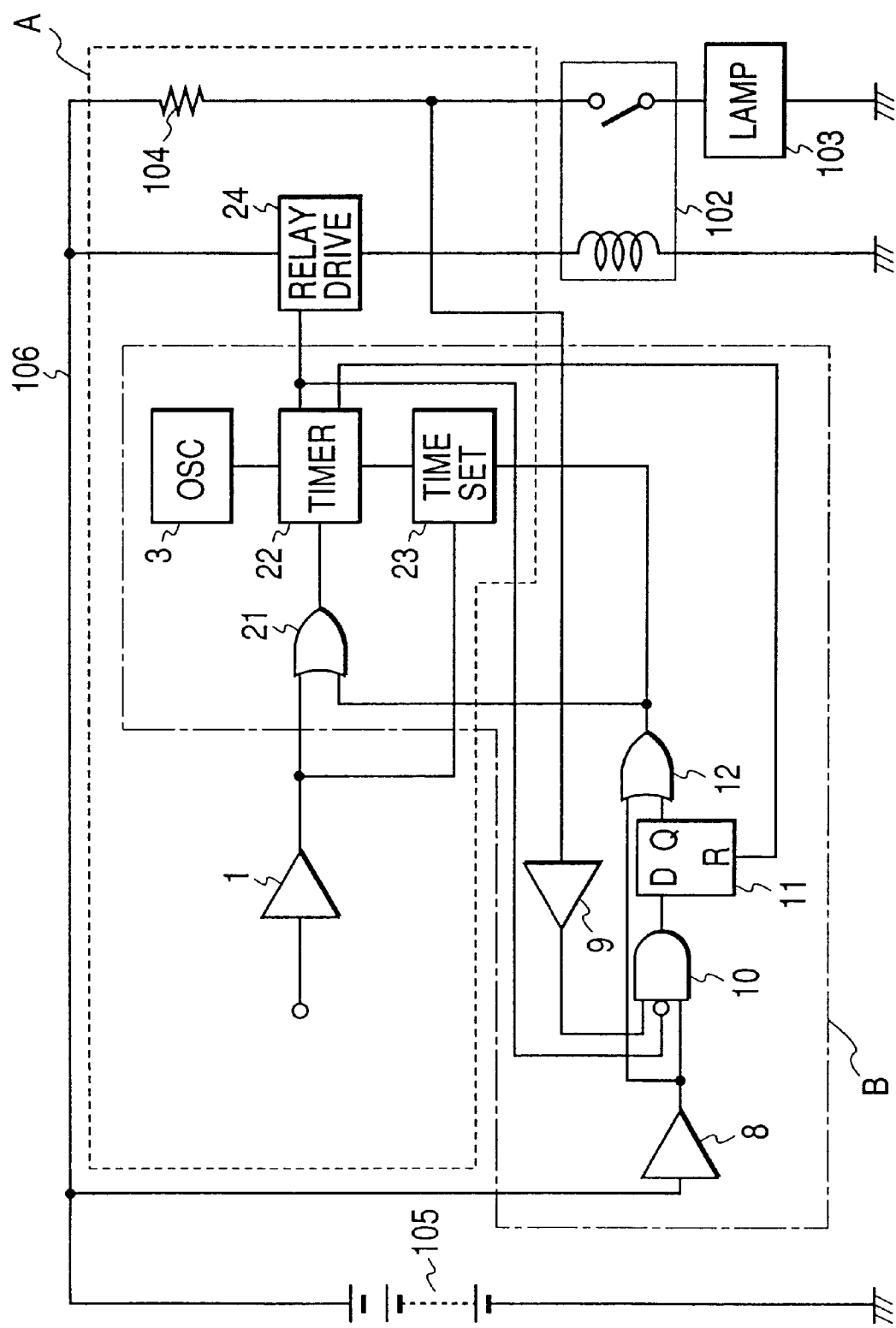
FIG. 4 is a diagram of a vehicular direction indicating apparatus with over-voltage protection according to a second embodiment of this invention.

FIG. 4 shows a second embodiment of this invention which is similar to the embodiment of FIG. 2 except for design changes explained hereinafter. The embodiment of FIG. 4 includes a direction indicating circuit "A", an over-voltage protection circuit "B", a relay 102, a direction indicating lamp 103, and a current sensing resistor 104 which are supplied with electric energy from a battery 105 via a power feed line 106. The direction indicating circuit "A" and the over-voltage protection circuit "B" have a common portion.

The direction indicating circuit "A" includes an input signal detection circuit 1, an oscillation circuit 3, an OR gate 21, a timer circuit 22, a time setting circuit 23, and a relay drive circuit 24. The oscillator 3 generates and outputs a clock pulse signal having a predetermined frequency. The OR gate 21 operates to generate and output a start signal in response to an effective input signal and an over-voltage protection hold signal. The time setting circuit 23 operates to set a predetermined time (a setting time). The current sensing resistor 104 is contained in the direction indicating circuit "A". The oscillation circuit 3, the OR gate 21, the timer circuit 22, and the time setting circuit 23 are also contained in the over-voltage protection circuit "B".

The over-voltage protection circuit "B" includes an over-voltage detection circuit 8, a current detection circuit 9, a logic circuit 10, a latch circuit 11, and an OR gate 12. The logic circuit 10 operates to detect whether or not an over-voltage detection signal and a load current detection signal are equal in logic state.

When the input signal detection circuit 1 senses an effective input signal, the OR gate 21 outputs a start signal in response to the output signal of the input signal detection circuit 1. The timer circuit 22 implements time control in response to the start signal outputted from the OR gate 21 according to the time setting by the time setting circuit 23. The relay drive circuit 24 opens and closes the switch of the relay 102 at timings set by the timer circuit 22.

When an over-voltage occurs at the power feed line 106, the over-voltage detection circuit 8 operates to force the relay drive circuit 24 to its conductive state. The timer circuit 22 and the time setting circuit 23 cooperate to set a time interval during which the relay drive circuit 24 is forcedly held in its conductive state. In the case where the current detection circuit 9 detects a current of a predetermined magnitude or more and the over-voltage detection circuit 8 detects the presence of the over-voltage, the logic circuit 10 outputs an active signal to the latch circuit 11. The latch circuit 11 latches the active signal from the logic circuit 10, and continues the relay drive circuit 24 in its conductive state. When the timer circuit 22 decides that the setting time has elapsed, the latching by the latch circuit 11 is canceled.

Third Embodiment

Figure 5:
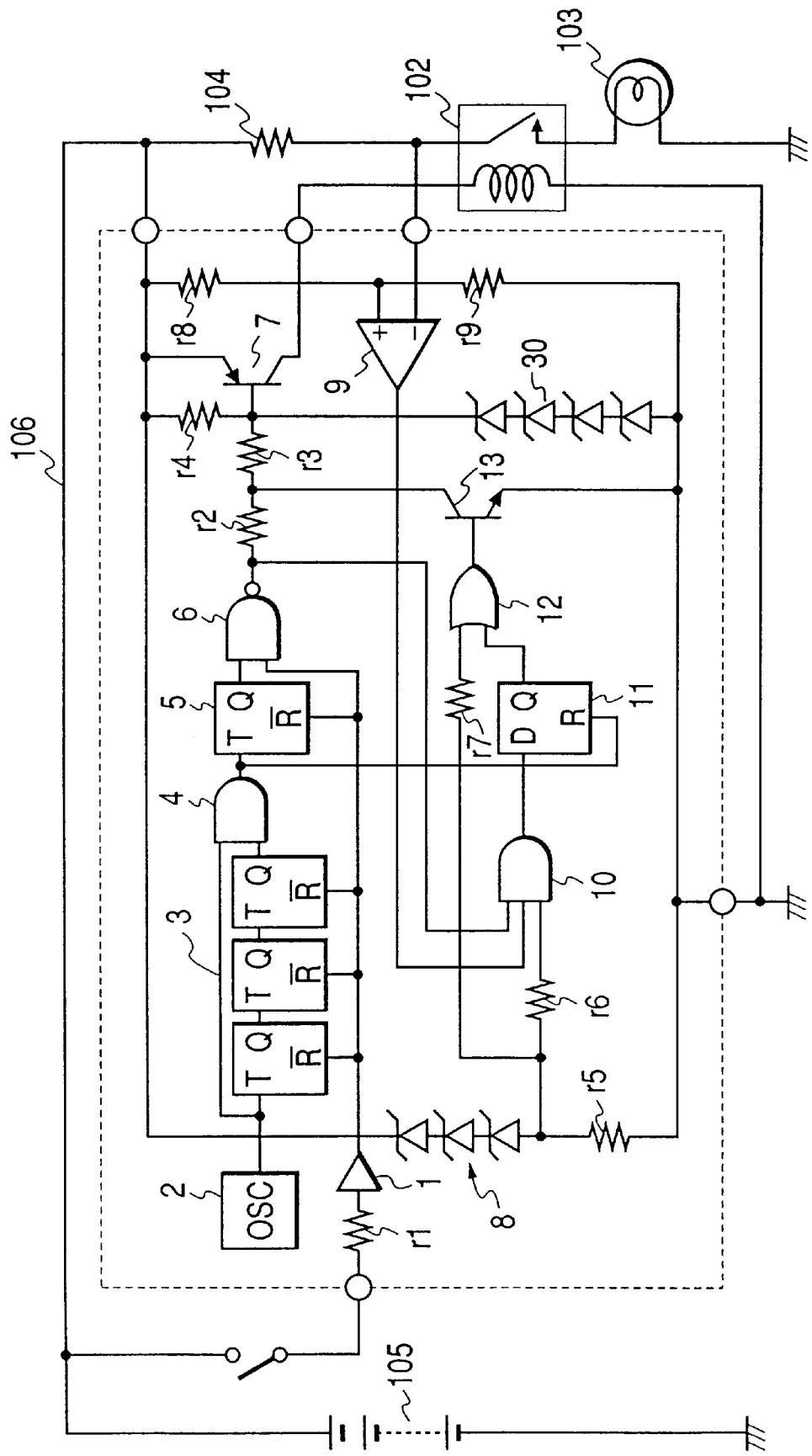
FIG. 5 is a diagram of a vehicular direction indicating apparatus with over-voltage protection according to a third embodiment of this invention.

FIG. 5 shows a third embodiment of this invention which is similar to the embodiment of FIG. 2 except for an additional design explained hereinafter. The embodiment of FIG. 5 includes a stack or a cascade combination 30 of Zener diodes. The cathode end of the Zener diode stack 30 is connected to the junction among the base of the transistor 7, the resistor r3, and the resistor r4. The anode of the Zener diode stack 30 is grounded.

The Zener diode stack 30 helps an over-voltage escape from the power feed line 106 toward the ground. In addition, the Zener diode stack 30 protects the transistors 7 and 13, the NAND gate 6, and the AND gate 10 against the over-voltage.

Fourth Embodiment

Figure 6:
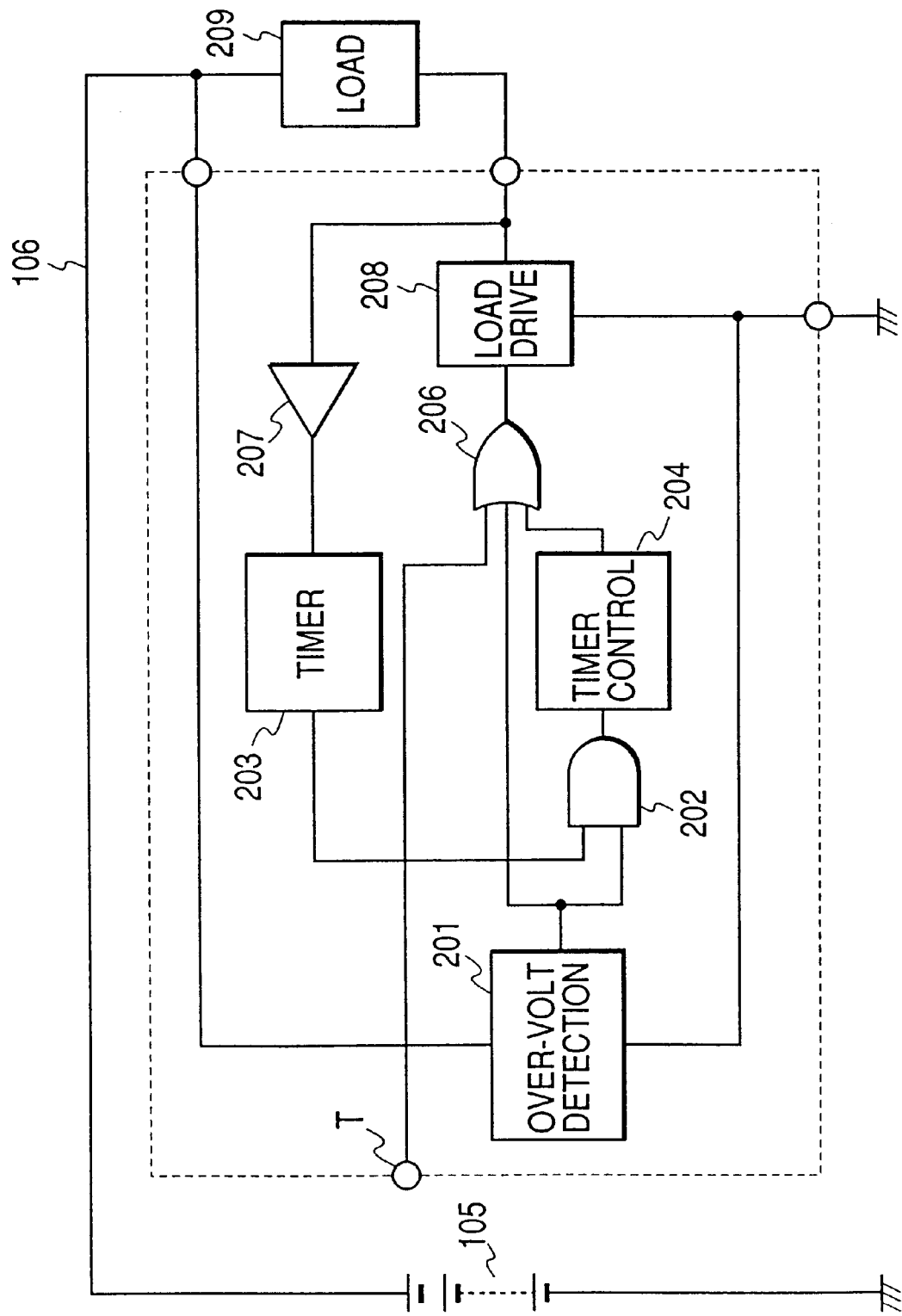
FIG. 6 is a diagram of an over-voltage protection apparatus according to a fourth embodiment of this invention.

FIG. 6 shows an over-voltage protection apparatus according to a fourth embodiment of this invention. The apparatus of FIG. 6 includes an over-voltage detection circuit 201, an AND gate 202, a timer circuit 203, a timer control circuit 204, an OR gate 206, a current detection circuit 207, a load drive circuit 208, and a load 209. The AND gate 202 operates to detect whether or not an over-voltage detection signal and a load current detection signal are equal in logic state. The timer circuit 203 operates to detect that the load current detection signal continues to be in an effective state during a predetermined time or longer. The timer control circuit 204 operates to set a discharge setting time for an over-voltage. The current detection circuit 207 includes, for example, a comparator. The current detection circuit 207 operates to detect a discharge current of a given level (a given magnitude) or more. The load drive circuit 208 includes, for example, a power transistor. The load 209 has a given low impedance. The load 209 includes, for example, a lamp.

When an over-voltage occurs at a power feed line 106, the over-voltage detection circuit 201 activates the load drive circuit 208 via the OR gate 206. As a result, the over-voltage is permitted to escape from the power feed line 106 toward the ground via the low-impedance load 209 and the load drive circuit 208 on a discharge basis.

On the other hand, the current detection circuit 207 detects a discharge current which flows through the low-impedance load 209. The current detection circuit 207 moves the timer circuit 203 into operation in response to the detected discharge current. The timer circuit 203 counts clock pulses to measure the time interval during which the discharge current continues to flow through the low-impedance load. When the measured time interval reaches a predetermined time interval, the timer circuit 203 outputs a high-level signal to the AND gate 202 which indicates that the over-voltage has a long lifetime. In the case where the over-voltage detection circuit 201 continues to detect the presence of the over-voltage, when the AND gate 202 receives the high-level signal from the timer circuit 203, the AND gate 202 outputs a high-level signal to the timer control circuit 204 which corresponds to a long-time discharge command. The timer circuit 204 outputs a high-level signal (an active signal) to the load drive circuit 208 via the OR gate 206 to continue the discharge during a predetermined time (in the rage of, for example, 200 ms to 300 ms) since the moment of the reception of the high-level signal from the AND gate 202.

Accordingly, an over-voltage at the power feed line 106 is recognized as having a long lifetime in the case where a discharge current of the given level or more continues to flow from the power feed line 106 toward the ground via the low-impedance load 209 on a discharge basis during the predetermined time interval or longer. Provided that the over-voltage is still present at the moment of this recognition, the discharge via the low-impedance load 209 is forcedly continued for the predetermined time regardless of the result of the detection about the over-voltage.

Thus, the inductance of the power feed line 106 is prevented from causing an over-voltage again at the power feed line 106 immediately after the discharge is cut off.

It should be noted that the forced discharge may be implemented when a discharge current of the given level or more is detected.

Fifth Embodiment

Figure 7:
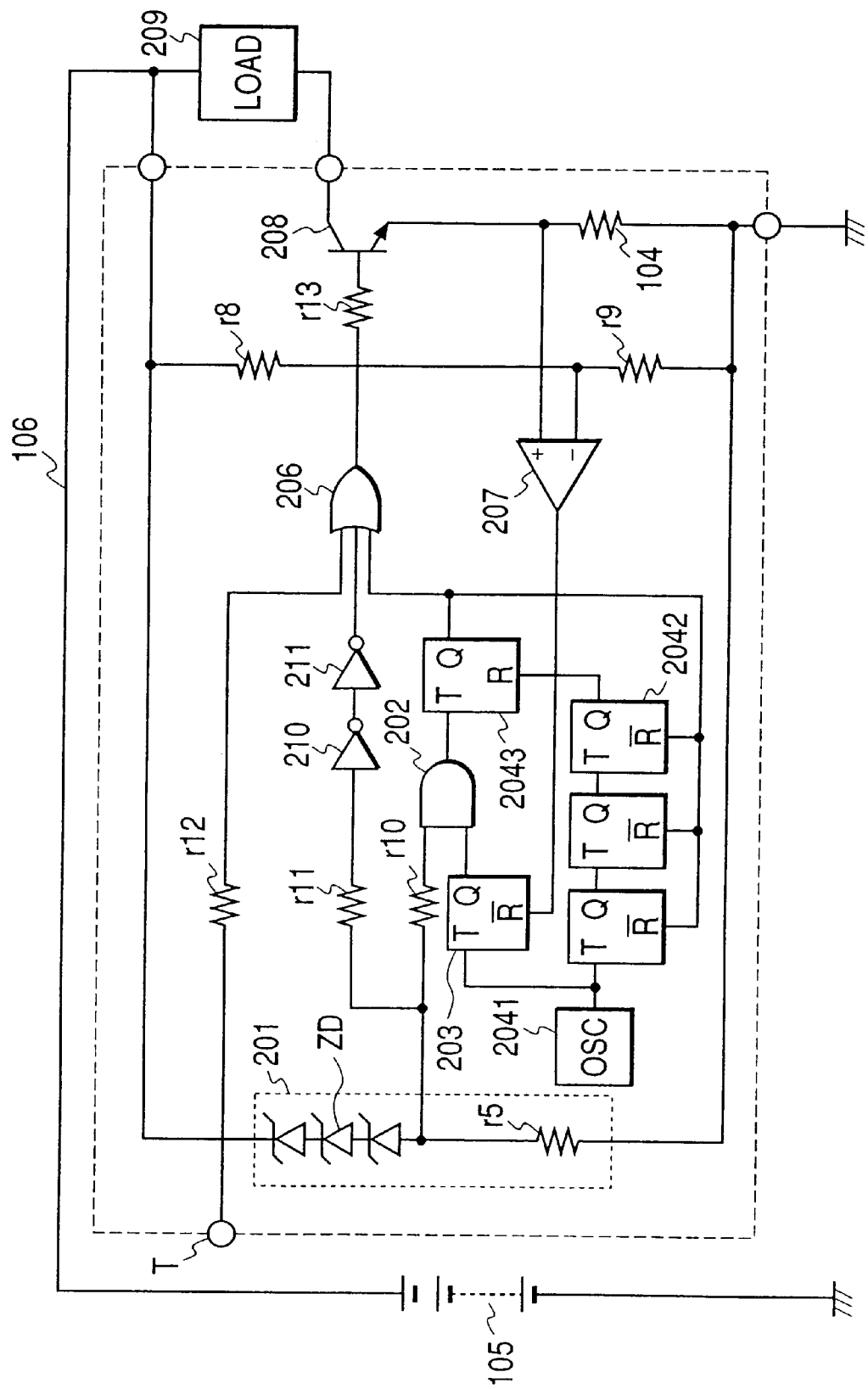
FIG. 7 is a diagram of an over-voltage protection apparatus according to a fifth embodiment of this invention.

FIG. 7 shows an over-voltage protection apparatus according to a fifth embodiment of this invention. The apparatus of FIG. 7 is similar to the apparatus of FIG. 6 except for design changes explained hereinafter.

The apparatus of FIG. 7 includes an over-voltage detection circuit 201 which has a cascade combination of Zener diodes ZD. The over-voltage detection circuit 201 also includes a resistor r5 which is connected in series with the cascade combination of the Zener diodes ZD.

Also, the apparatus of FIG. 7 includes an oscillation circuit 2041, a counter circuit 2042, and a latch circuit 2043 which compose a timer control circuit corresponding to the timer control circuit 204 in FIG. 6. The oscillation circuit 2041 generates and outputs a clock pulse signal having a predetermined frequency. The counter circuit 2042 includes a series combination of T flip-flops. The latch circuit 2043 includes, for example, a D flip-flop.

Furthermore, the apparatus of FIG. 7 includes a timer circuit 203. The timer circuit 203 has, for example, a T flip-flop or a latch circuit.

With reference to FIG. 7, the positive terminal of a battery 105 is connected via a power feed line 106 to a first end of a load 209, a first end of a resistor r8, and the cathode end of the Zener diode combination within the over-voltage detection circuit 201. The negative terminal of the battery 105 is grounded. The load 209 has a given low impedance. The load 209 includes, for example, a lamp. A second end of the low-impedance load 209 is connected to the collector of an NPN transistor 208 corresponding to the load drive circuit 208 in FIG. 6. The emitter of the transistor 208 is grounded via a current sensing resistor 104. A second end of the resistor r8 is connected to a first end of a resistor r9. A second end of the resistor r9 is grounded.

The anode end of the Zener diode combination within the over-voltage detection circuit 201 is connected to a first end of the resistor r5, a first end of a resistor r10, and a first end of a resistor r11. A second end of the resistor r5 is grounded. A second end of the resistor r10 is connected to a first input terminal of an AND gate 202. A second end of the resistor r11 is connected to the input terminal of a NOT gate (an inverter) 210. The output terminal of the NOT gate 210 is connected to the input terminal of a NOT gate (an inverter) 211. The output terminal of the NOT gate 211 is connected to a first input terminal of an OR gate 206. The NOT gates 210 and 211 compose a buffer for providing a predetermined signal delay.

The output terminal of the oscillation circuit 2041 is connected to the input terminal of the counter circuit 2042. The output terminal of the counter circuit 2042 is connected to a reset terminal of the latch circuit 2043. The output terminal of the oscillation circuit 2041 is connected to the input terminal of the timer circuit 203. The output terminal of the timer circuit 203 is connected to a second input terminal of the AND gate 202. The output terminal of the AND gate 202 is connected to the input terminal of the latch circuit 2043. The output terminal of the latch circuit 2043 is connected to a second input terminal of the OR gate 206. The output terminal of the latch circuit 2043 is also connected to a reset terminal of the counter circuit 2042.

A third input terminal of the OR gate 206 is connected via a resistor r12 to an input terminal "T" for an input signal of a command to activate the low-impedance load 209. The output terminal of the OR gate 206 is connected to the base of the transistor 208 via a resistor r13.

A comparator 207 has a first input terminal connected to the junction between the current sensing resistor 104 and the emitter of the transistor 208. A second input terminal of the comparator 207 is connected to the junction between the resistors r8 and r9. The output terminal of the comparator 207 is connected to a reset terminal of the timer circuit 203.

The apparatus of FIG. 7 operates in a mode which can change among different modes including a load activating mode, a long over-voltage responsive mode, and a short over-voltage responsive mode.

The load activating mode of operation of the apparatus of FIG. 7 will be explained hereinafter. A high-level input signal representing a command to activate the low-impedance load 209 is applied to the OR gate 206 via the input terminal "T" and the resistor r12. The high-level signal passes through the OR gate 206, and then reaches the base of the transistor 208 via the resistor r13 so that the emitter-collector path of the transistor 208 changes to a conductive state (an on state). When the transistor 208 changes to its conductive state, a current generated by the battery 105 flows through the low-impedance load 209, the transistor 208, and the current sensing resistor 104. Accordingly, the low-impedance load 209 is activated.

The long over-voltage responsive mode of operation of the apparatus of FIG. 7 will be explained hereinafter. It is assumed that an over-voltage occurs at the power feed line 106 during a time interval longer than a reference time interval. When the voltage at the power feed line 106 exceeds a predetermined reference level, the over-voltage detection circuit 201 outputs a high-level signal to the OR gate 206 via the resistor r11 and the NOT gates 210 and 211 as an indication of the occurrence of an over-voltage. The predetermined reference voltage is given by the breakdown voltage related to the Zener diode combination within the over-voltage detection circuit 201. The high-level signal indicative of the over-voltage passes through the OR gate 206, and then reaches the base of the transistor 208 via the resistor r13 so that the transistor 208 changes to its conductive state. When the transistor 208 changes to its conductive state, the over-voltage starts escaping from the power feed line 106 toward the ground via the low-impedance load 209, the transistor 208, and the current sensing resistor 104. Accordingly, the over-voltage starts to be removed by discharge.

The resistors r8 and r9 cooperate to divide the voltage at the power feed line 106 (that is, the voltage across the battery 105). The division-resultant voltage is applied to the comparator 207 as a reference voltage. The voltage at the junction between the current sensing resistor 104 and the emitter of the transistor 208 is proportional to the current flowing through the current sensing resistor 104, that is, the discharge current flowing from the power feed line 106 to the ground. The voltage at the junction between the current sensing resistor 104 and the emitter of the transistor 208 is applied to the comparator 207 as an indication of the discharge current. The device 207 compares the current-indicating voltage with the previously-mentioned reference voltage. When the current-indicating voltage is equal to or higher than the reference voltage, the comparator 207 outputs a high-level signal to the reset terminal of the timer circuit 203. In other words, the comparator 207 detects whether the transistor 208 is conductive or non-conductive. The comparator 207 outputs a high-level signal when the transistor 208 is conductive. The timer circuit 203 outputs a high-level signal to the AND gate 202 in response to the high-level signal from the comparator 207. The timer circuit 203 receives the output signal of the oscillation circuit 2041. The timer circuit 203 continues to output the high-level signal to the AND gate 202 until receiving a next clock pulse from the oscillation circuit 2041. The output signal of the timer circuit 203 returns to a low-level state in response to the next clock pulse from the oscillation circuit 2041.

Also, the over-voltage detection circuit 201 outputs the high-level signal indicative of the over-voltage to the AND gate 202 via the resistor r10. Thus, in the case of an over-voltage having a long lifetime, the AND gate 202 simultaneously receives the high-level signals from the over-voltage detection circuit 201 and the timer circuit 203 so that the AND gate 202 outputs a high-level signal to the latch circuit 2043. The device 2043 latches the high-level signal outputted from the AND gate 202. The latched high-level signal is outputted from the latch circuit 2043 to the OR gate 206. The high-level signal passes through the OR gate 206, and then reaches the base of the transistor 208 via the resistor r13 so that the transistor 208 continues to be in its conductive state. Thus, the over-voltage continues to escape from the power feed line 106 toward the ground via the low-impedance load 209, the transistor 208, and the current sensing resistor 104. Accordingly, the over-voltage continues to be removed by discharge.

The latched high-level signal is outputted from the latch circuit 2043 to the reset terminal of the counter circuit 2042.

The counter circuit 2042 is reset in response to the high-level signal outputted from the latch circuit 2043. The counter circuit 2042 receives the output signal of the oscillation circuit 2041. The counter circuit 2042 counts clock pulses in the output signal of the oscillation circuit 2041. After the counter circuit 2042 is reset, the counter circuit 2042 repetitively outputs a high-level signal to the reset terminal of the latch circuit 2043 at a setting period (a setting time) corresponding to a predetermined number of counted clock pulses. The latch circuit 2043 is reset in response to the high-level signal outputted from the counter circuit 2042. When the latch circuit 2043 is reset, the output signal of the latch circuit 2043 returns to a low-level state. Provided that the OR gate 206 receives a low-level signal via the input terminal "T" and the output signal of the over-voltage detection circuit 201 is in its low-level state, the OR gate 206 outputs a low-level signal to the base of the transistor 208 via the resistor r13 in response to the low-level signal outputted from the latch circuit 2043. Thus, the transistor 208 returns to its non-conductive state. Accordingly, the discharge for removing the over-voltage is suspended.

The short over-voltage responsive mode of operation of the apparatus of FIG. 7 will be explained hereinafter. It is assumed that an over-voltage occurs at the power feed line 106 during a time interval shorter than the reference time interval. When the voltage at the power feed line 106 exceeds the predetermined reference level, the over-voltage detection circuit 201 outputs a high-level signal to the OR gate 206 via the resistor r11 and the NOT gates 210 and 211 as an indication of the occurrence of an over-voltage. The high-level signal indicative of the over-voltage passes through the OR gate 206, and then reaches the base of the transistor 208 via the resistor r13 so that the transistor 208 changes to its conductive state. When the transistor 208 changes to its conductive state, the over-voltage starts escaping from the power feed line 106 toward the ground via the low-impedance load 209, the transistor 208, and the current sensing resistor 104. Accordingly, the over-voltage starts to be removed by discharge.

When the current-indicating voltage is equal to or higher than the reference voltage, the comparator 207 outputs a high-level signal to the reset terminal of the timer circuit 203. The timer circuit 203 outputs a high-level signal to the AND gate 202 in response to the high-level signal from the comparator 207. Since the over-voltage has a short lifetime, the output signal of the over-voltage detection device 201 has already returned to its low-level state at the moment of the low-to-high change of the output signal of the timer circuit 203. Accordingly, the AND gate 202 continuously outputs a low-level signal to the latch circuit 2043, and the output signal of the latch circuit 2043 remains in its low-level state. In this case, the OR gate 206 outputs a low-level signal to the base of the transistor 208 via the resistor r13 when the output signal of the NOT gate 211 returns to its low-level state. Thus, the transistor 208 returns to its non-conductive state. Accordingly, the discharge for removing the over-voltage is suspended. As understood from the above explanation, the latch circuit 2043 is prevented from implementing the continuation of the discharge for removing the over-voltage.

Sixth Embodiment

Figure 8:
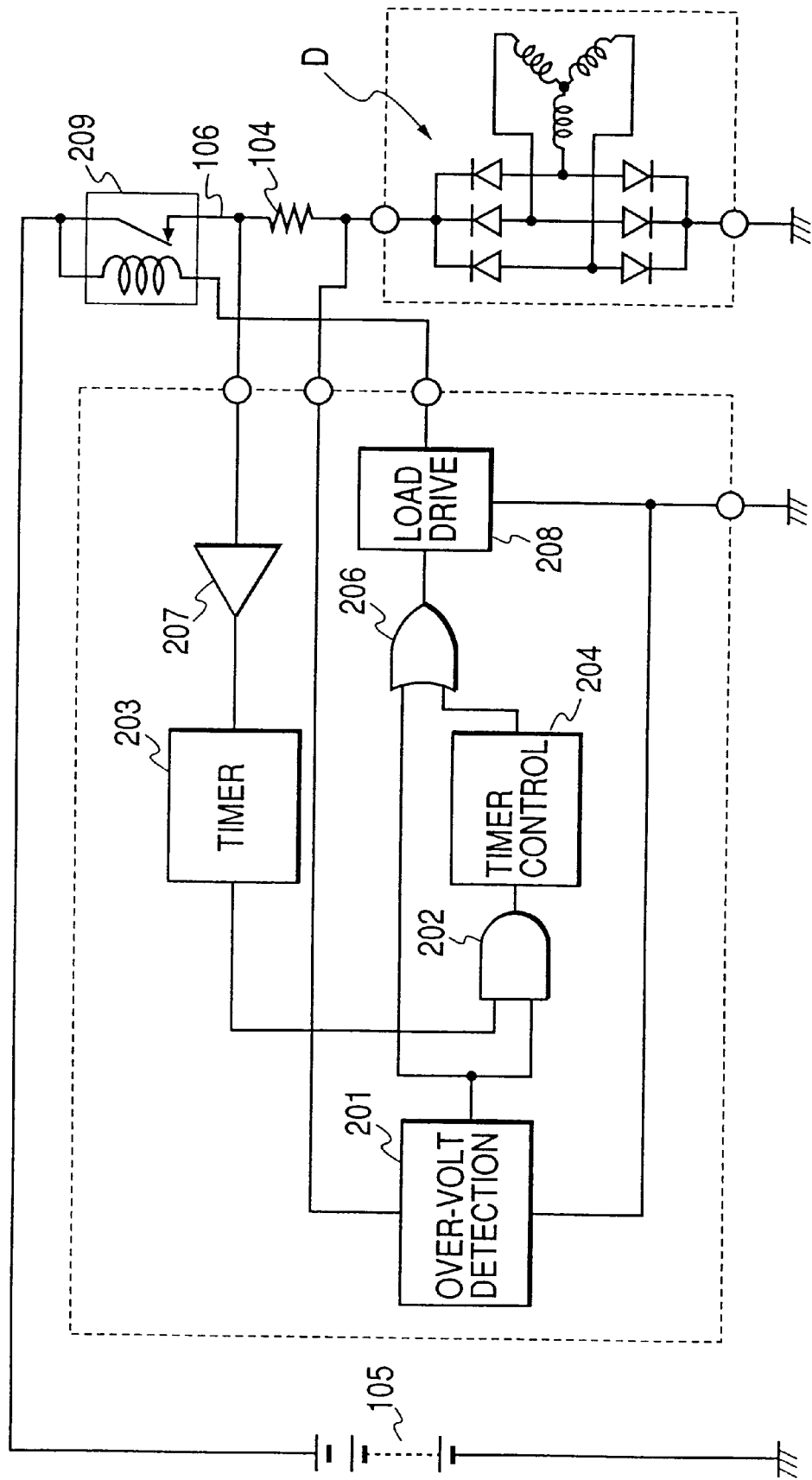
FIG. 8 is a diagram of an over-voltage protection apparatus according to a sixth embodiment of this invention.

FIG. 8 shows a sixth embodiment of this invention which is similar to the embodiment of FIG. 6 except for design changes explained hereinafter.

The embodiment of FIG. 8 includes a load 209 having a given low impedance. The load 209 has a relay. The switch of the relay 209 is of the normally-closed type. An alternator "D" is connected to a battery 105 via a current sensing resistor 104 and the switch of the relay 209. The alternator "D" operates to generate electric energy by which the battery 105 can be charged. It is possible to prevent the battery 105 from being over-charged by the alternator "D" as explained later.

A power feed line 106 connects the current sensing resistor 104 and the switch of the relay 209. The junction between the current sensing resistor 104 and the switch of the relay 209 is connected to a current detection circuit 207. The junction between the current sensing resistor 104 and the alternator "D" is connected to an over-voltage detection circuit 201. A load drive circuit 208 is connected to the positive terminal of the battery 105 via the control winding of the relay 209.

When an over-voltage occurs at the power feed line 106, the over-voltage detection circuit 201 outputs a high-level signal indicative of the over-voltage to the load drive circuit 208 via an OR gate 206. The load drive circuit 208 changes to its conductive state in response to the high-level signal outputted from the over-voltage detection circuit 201. When the load drive circuit 208 changes to its conductive state, the control winding of the relay 209 is energized so that the switch of the relay 209 is opened. Accordingly, the battery 105 is disconnected from the alternator "D". Thus, the battery 105 is protected against the over-voltage. In addition, it is possible to prevent the battery 105 from being over-charged.

An AND gate 202 receives the output signal of the over-voltage detection circuit 201 which represents whether or nor an over-voltage is generated by the alternator "D". The AND gate 202 receives the output signal of a timer circuit 203 which represents whether or nor an over-current is generated by the alternator "D". When an over-voltage and an over-current are simultaneously present, the AND gate 202 outputs a high-level signal to a timer control circuit 204. The timer control circuit 204 outputs a high-level signal to the load drive circuit 208 via the OR gate 206 in response to the high-level signal outputted from the AND gate 202. The high-level output signal of the timer control circuit 204 continues the load drive circuit 208 in its conductive state. Thus, the switch of the relay 209 continues to be opened, and the battery 105 continues to be disconnected from the alternator "D". The output signal of the timer control circuit 204 remains in its high-level state only during a predetermined time interval. Therefore, the switch of the relay 209 is closed and the battery 105 is connected to the alternator "D" when the predetermined time interval has elapsed.

The timer circuit 203 operates to discriminate an over-current with a lifetime shorter than a given lifetime from an over-current with a lifetime equal to or longer than the given lifetime. The timer circuit 23 prevents the AND gate 202 from outputting a high-level signal in response to an over-current having a short lifetime. Accordingly, the timer circuit 23 prevents the switch of the relay 209 from being frequency changed in response to a short-lifetime over-current.

Seventh Embodiment

Figure 9:
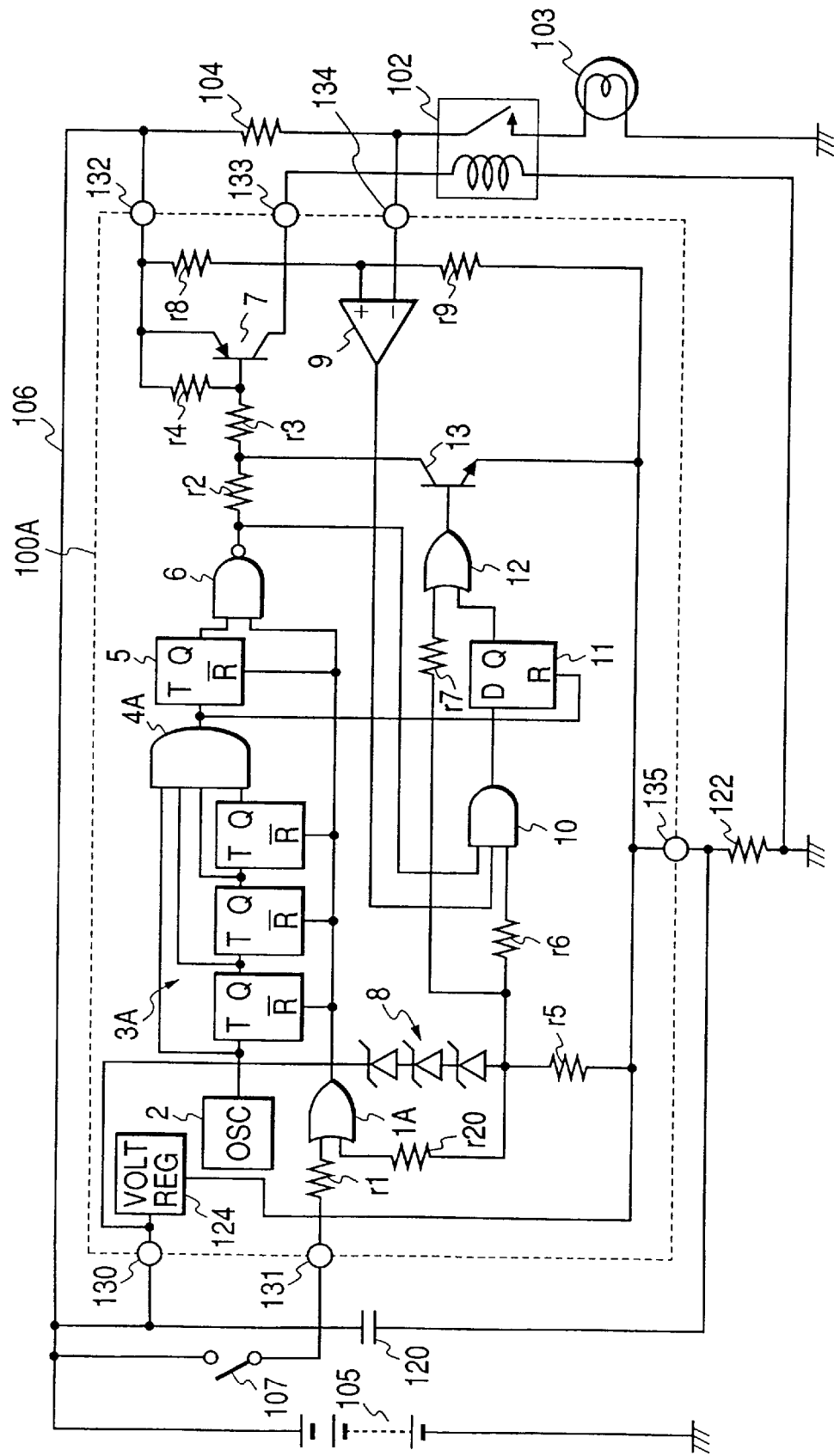
FIG. 9 is a diagram of a vehicular direction indicating apparatus with over-voltage protection according to a seventh embodiment of this invention.

FIG. 9 shows a vehicular direction indicating apparatus with over-voltage protection according to a seventh embodiment of this invention. The apparatus of FIG. 9 includes a main circuit 100A formed by an IC chip having connection terminals 130, 131, 132, 133, 134, and 135. The main circuit 100A includes a direction indicating circuit and an over-voltage protection circuit corresponding to the direction indicating circuit 100 and the over-voltage protection circuit 101 respectively.

The apparatus of FIG. 9 also includes a relay 102, a direction indicator or a direction indicating lamp 103, and a current sensing resistor 104. The main circuit 10A, the relay 102, the direction indicating lamp 103, and the current sensing resistor 104 are connected to a battery 105 via a power feed line 106. The main circuit 100A, the relay 102, the direction indicating lamp 103, and the current sensing resistor 104 are supplied with electric energy from the battery 105 via the power feed line 106. The direction indicating lamp 103 forms a load on the battery 105.

The apparatus of FIG. 9 further includes a direction indicating switch 107, a capacitor 120, and a resistor 122. The direction indicating switch 107 is connected between the connection terminal 131 of the main circuit 100A and the positive terminal of the battery 105.

The positive terminal of the battery 105 is connected to a first end of the current sensing resistor 104 via the power feed line 106. The negative terminal of the battery 105 is grounded. A second end of the current sensing resistor 104 is connected via a switch of the relay 102 to a first end of the direction indicating lamp 103. The switch of the relay 102 is of the normally-open type. A second end of the direction indicating lamp 103 is grounded. A first end of a control winding of the relay 102 is connected to the connection terminal 133 of the main circuit 100A. A second end of the control winding of the relay 102 is grounded.

The positive terminal of the battery 105 is also connected to the connection terminal 132 of the main circuit 100A via the power feed line 106. In addition, the positive terminal of the battery 105 is connected to the connection terminal 130 of the main circuit 100A via the power feed line 106. A first end of the capacitor 120 is connected to the junction between the positive terminal of the battery 105 and the connection terminal 130 of the main circuit 100A. A second end of the capacitor 120 is grounded via the resistor 122. The junction between the current sensing resistor 104 and the switch of the relay 102 is connected to the connection terminal 134 of the main circuit 100A.

The main circuit 100A includes an input signal detection circuit 1A having an OR gate. Also, the main circuit 100A includes an oscillation circuit 2, a timer circuit 3A, an AND gate 4A, a frequency division circuit 5, a NAND gate 6, a load drive switch 7, and resistors r1, r2, r3, and r4. The oscillation circuit 2 generates and outputs a clock pulse signal having a predetermined frequency. The timer circuit 3A includes a series combination of three T flip-flops. The frequency division circuit 5 includes a T flip-flop. The load drive switch 7 includes a PNP transistor.

A first input terminal of the OR gate (that is, the input signal detection circuit) 1A is connected via the resistor r1 to the connection terminal 131 which leads to the direction indicating switch 107. The direction indicating switch 107 is connected to the positive terminal of the battery 105. The output terminal of the OR gate 1A is connected to a reset terminal of the timer circuit 3A, a reset terminal of the frequency division circuit 5, and a first input terminal of the NAND gate 6. The output terminal of the oscillation circuit 2 is connected to the input terminal of the timer circuit 3A and a first input terminal of the AND gate 4A.

As previously indicated, the timer circuit 3A includes a series combination of three T flip-flops. The input terminal of the first T flip-flop in the timer circuit 3A is connected to the output terminal of the oscillation circuit 2. The reset terminal of the first T flip-flop in the timer circuit 3A is connected to the output terminal of the OR gate 1A. The output terminal of the first T flip-flop in the timer circuit 3A is connected to the input terminal of the second T flip-flop therein. Also, the output terminal of the first T flip-flop in the timer circuit 3A is connected to a second input terminal of the AND gate 4A. The reset terminal of the second T flip-flop in the timer circuit 3A is connected to the output terminal of the OR gate 1A. The output terminal of the second T flip-flop in the timer circuit 3A is connected to the input terminal of the third T flip-flop therein. Also, the output terminal of the second T flip-flop in the timer circuit 3A is connected to a third input terminal of the AND gate 4A. The reset terminal of the third T flip-flop in the timer circuit 3A is connected to the output terminal of the OR gate 1A. The output terminal of the third T flip-flop in the timer circuit 3A is connected to a fourth input terminal of the AND gate 4A.

The output terminal of the AND gate 4A is connected to the input terminal of the frequency division circuit 5. The output terminal of the frequency division circuit 5 is connected to a second input terminal of the NAND gate 6. The output terminal of the NAND gate 6 is connected to the base of the transistor 7 via a series combination of the resistors r2 and r3. The emitter of the transistor 7 is connected to the positive terminal of the battery 105 via the connection terminal 132 and the power feed line 106. The collector of the transistor 7 is grounded via the connection terminal 133 and the control winding of the relay 102. A first end of the resistor r4 is connected to the base of the transistor 7. A second end of the resistor r4 is connected to the positive terminal of the battery 105 via the connection terminal 132 and the power feed line 106.

The main circuit 100A includes an over-voltage detection circuit 8, a load current detection circuit 9, an AND gate 10, a latch circuit 11, an OR gate 12, an NPN transistor 13, and resistors r5, r6, r7, r8, r9, and r20. The over-voltage detection circuit 8 includes a cascade combination of Zener diodes. The over-voltage detection circuit 8 also includes the resistor r5 which is connected in series with the cascade combination of the Zener diodes. The load current detection circuit 9 includes a comparator. The latch circuit 11 includes, for example, a D flip-flop.

The main circuit 100A contains a voltage regulation circuit 124 having a power input line connected to the connection terminal 130. The voltage regulation circuit 124 applies a regulated voltage to parts within the main circuit 100A. The voltage regulation circuit 124 has a ground line connected to the connection terminal 135. The connection terminal 135 is grounded via the resistor 122.

The cathode end of the Zener diode combination within the over-voltage detection circuit 8 is connected to the connection terminal 130. As previously indicated, the connection terminal 130 is connected via the power feed line 106 to the positive terminal of the battery 105. The anode end of the Zener diode combination within the over-voltage detection circuit 8 is connected via the resistor r5 to the connection terminal 135. As previously indicated, the connection terminal 135 is grounded via the resistor 122. Also, the anode end of the Zener diode combination within the over-voltage detection circuit 8 is connected via the resistor r6 to a first input terminal of the AND gate 10. Furthermore, the anode end of the Zener diode combination within the over-voltage detection circuit 8 is connected via the resistor r7 to a first end of the OR gate 12. The junction between the resistor r5 and the anode end of the Zener diode combination within the over-voltage detection circuit 8 is connected via the resistor r20 to a second input terminal of the OR gate 1A.

A first end of the resistor r8 is connected to the positive terminal of the battery 105 via the connection terminal 132 and the power feed line 106. A second end of the resistor r8 is connected to a first input terminal of the load current detection circuit 9 and a first end of the resistor r9. A second end of the resistor r9 is connected to the connection terminal 135. As previously indicated, the connection terminal 135 is grounded via the resistor 122. A second input terminal of the load current detection circuit 9 is connected via the connection terminal 134 to the junction between the current sensing resistor 104 and the switch of the relay 102. The output terminal of the load current detection circuit 9 is connected to a second input terminal of the AND gate 10. A third input terminal of the AND gate 10 is connected to the output terminal of the NAND gate 6. The output terminal of the AND gate 10 is connected to the input terminal of the latch circuit 11. A reset terminal of the latch circuit 11 is connected to the output terminal of the AND gate 4A. The output terminal of the latch circuit 11 is connected to a second input terminal of the OR gate 12. The output terminal of the OR gate 12 is connected to the base of the transistor 13. The emitter of the transistor 13 is connected to the connection terminal 135. As previously indicated, the connection terminal 135 is grounded via the resistor 122. The collector of the transistor 135 is connected to the junction between the resistors r2 and r3.

Operation of the apparatus of FIG. 9 is similar to that of the apparatus of FIG. 2 except for the following points. The capacitor 120 and the resistor 122 cooperate to protect the main circuit 100A from noise. In addition, the capacitor 120 and the resistor 122 provide a given delay to a signal inputted into the over-voltage detection circuit 8. Upon the occurrence of an over-voltage, the signal delay prevents the over-voltage detection circuit 8 from immediately responding to a voltage drop caused by the change of the switch of the relay 102 to its closed position (its on position). Accordingly, in this case, it is possible to detect whether or not a load current is present.

When the direction indicating switch 107 is closed, a high-level signal caused by the battery 105 is transmitted to the NAND gate 6 via the resistor r1 and the OR gate 1A. At the same time, the high-level signal is transmitted to the reset terminals of the timer circuit 3A and the frequency division circuit 5, thereby resetting the timer circuit 3A and the frequency division circuit 5. Even in the case where the direction indicating switch 107 remains open, when the voltage at the power feed line 106 exceeds a predetermined reference level, the over-voltage detection circuit 8 outputs a high-level signal to the OR gate 1A via the resistor r20. The high-level signal applied to the OR gate 1A enables the main circuit 100A to implement protection against the over-voltage.

Figure 10:
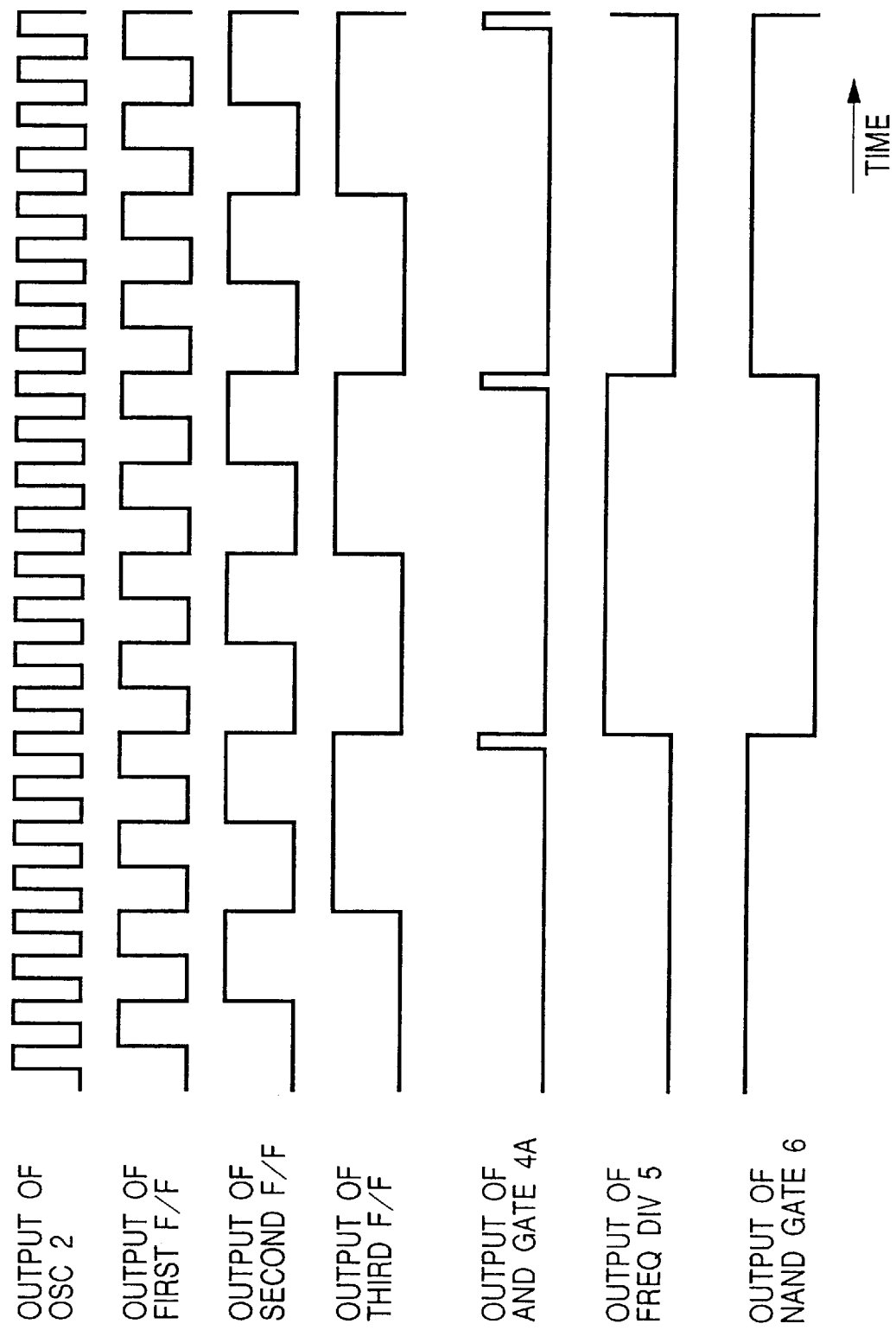
FIG. 10 is a time-domain diagram of signals in the apparatus of FIG. 9.

As shown in FIG. 10, the output signal of the oscillation circuit 2 (that is, a clock pulse signal) has a rectangular waveform with a predetermined frequency. The first T flip-flop in the timer circuit 3A halves the frequency of the output signal of the oscillation circuit 2. Accordingly, as shown in FIG. 10, the first T flip-flop in the timer circuit 3A outputs a rectangular pulse signal having a frequency equal to half the frequency of the output signal of the oscillation circuit 2. The second T flip-flop in the timer circuit 3A halves the frequency of the output signal of the first T flip-flop therein. Accordingly, as shown in FIG. 10, the second T flip-flop in the timer circuit 3A outputs a rectangular pulse signal having a frequency equal to half the frequency of the output signal of the first T-flip-flop. The third T flip-flop in the timer circuit 3A halves the frequency of the output signal of the second T flip-flop therein. Accordingly, as shown in FIG. 10, the third T flip-flop in the timer circuit 3A outputs a rectangular pulse signal having a frequency equal to half the frequency of the output signal of the second T-flip-flop.

The AND gate 4A implements AND operation among the output signal of the oscillation circuit 2 and the output signals of the first, second, and third T flip-flops in the timer circuit 3A. Accordingly, as shown in FIG. 10, the AND gate 4A outputs a pulse signal having a frequency equal to one eighth of the frequency of the output signal of the oscillation circuit 2. The frequency division circuit 5 halves the frequency of the output signal of the AND gate 4A. Accordingly, as shown in FIG. 10, the frequency division circuit 5 outputs a rectangular pulse signal having a frequency equal to half the frequency of the output signal of the AND gate 4A. Specifically, the logic state of the output signal of the frequency division circuit 5 changes in response to every falling edge in the output signal of the AND gate 4A. Under a given condition, the NAND gate 6 serves as a NOT gate (an inverter). Accordingly, in this case, as shown in FIG. 10, the NAND gate 6 outputs a rectangular pulse signal which agrees with an inversion of the output signal of the frequency division circuit 5.

Eighth Embodiment

Figure 11:
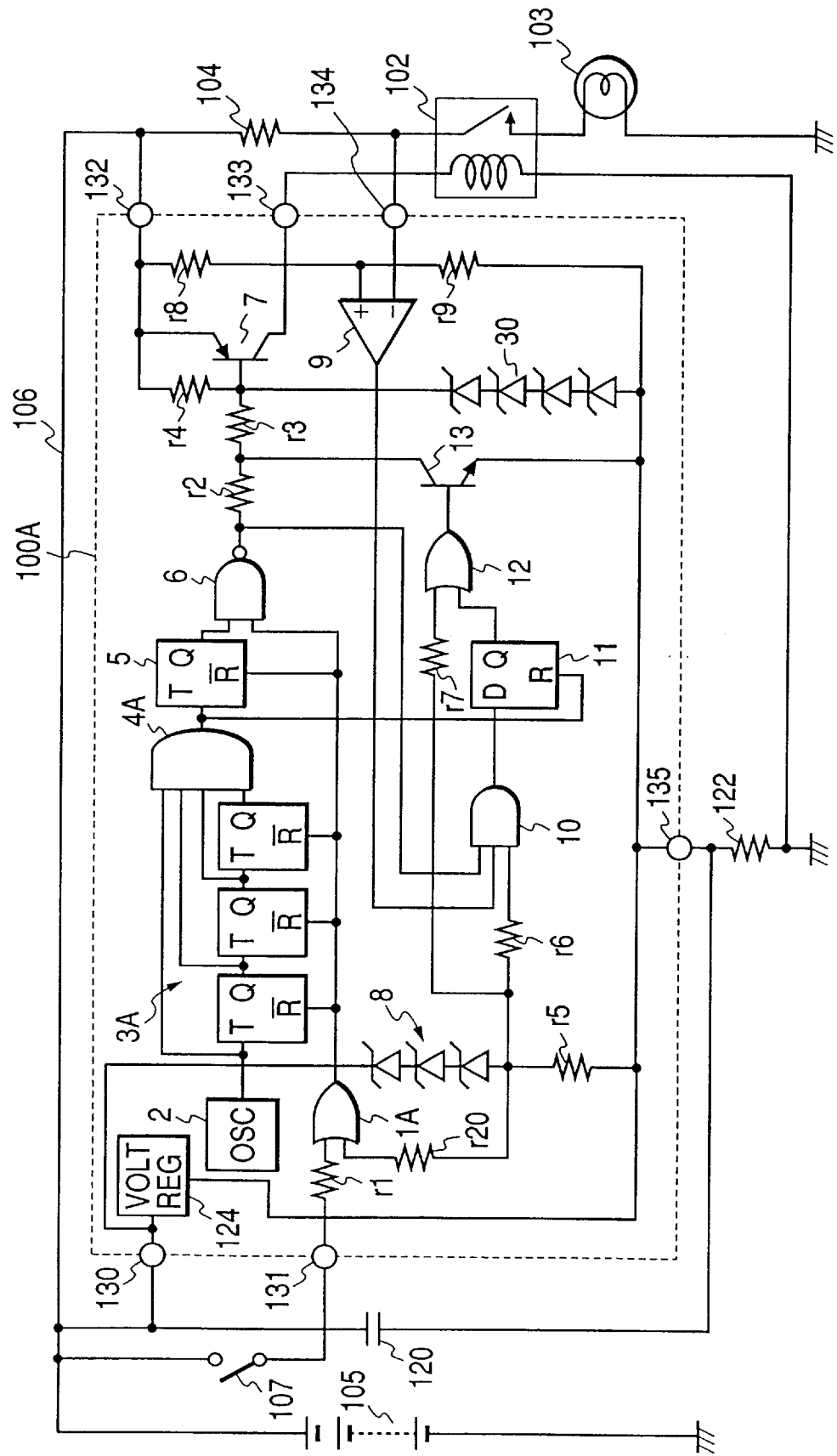
FIG. 11 is a diagram of a vehicular direction indicating apparatus with over-voltage protection according to an eighth embodiment of this invention.

FIG. 11 shows an eighth embodiment of this invention which is similar to the embodiment of FIG. 9 except for an additional design explained hereinafter. The embodiment of FIG. 11 includes a stack or a cascade combination 30 of Zener diodes. The cathode end of the Zener diode stack 30 is connected to the junction among the base of the transistor 7, the resistor r3, and the resistor r4. The anode of the Zener diode stack 30 is connected to the connection terminal 135. The connection terminal 135 is grounded via the resistor 122.

The Zener diode stack 30 helps an over-voltage escape from the power feed line 106 toward the ground. In addition, the Zener diode stack 30 protects the transistors 7 and 13, the NAND gate 6, and the AND gate 10 against the over-voltage.

What is claimed is:

1. An over-voltage protection apparatus comprising:

a load having a given low impedance;

current supplying means for supplying a current to the load;

a power feed line connecting the current supplying means and the load;

load drive means for controlling the supply of the current to the load by the current supplying means, wherein the load drive means includes a relay;

over-voltage detecting means for detecting a long-duration over-voltage at the power feed line;

discharge command means for, only when the over-voltage at the power feed line (i) has a duration longer than a response time of the relay and (ii) is detected by the over-voltage detecting means, controlling the load drive means to enable a discharge current to flow from the power feed line into the load and thereby to remove the long-duration over-voltage from the power feed line through discharge;

current detecting means for directly detecting the discharge current; and discharge continuing means for continuing the discharge and the flow of the discharge current from the power feed line in cases where the discharge current detected by the current detecting means exceeds a predetermined reference level.

2. An over-voltage protection apparatus as recited in claim 1, wherein the load includes a vehicular direction indicating lamp, and the load drive means includes said relay connected between the vehicular direction indicating lamp and the power feed line.

3. An apparatus as recited in claim 1, wherein the discharge continuing means operates for continuing the discharge and the flow of the discharge current from the power feed line to remove the over-voltage from the power feed line.

4. An apparatus as recited in claim 1, wherein the load drive means comprises said relay, and the predetermined reference level for the discharge current corresponds to a delay time of response operation of the relay.

* * * * *